United States Patent
Benner et al.

[11] Patent Number: 5,806,946
[45] Date of Patent: Sep. 15, 1998

[54] SWITCHGEAR CABINET WITH FRAME

[75] Inventors: Rolf Benner, Herborn; Walter Nicolai, Buseck; Heinrich Strackbein, Biebertal, all of Germany

[73] Assignee: Rittal-Werk Rudolf Loh GmbH & Co. KG, Herborn, Germany

[21] Appl. No.: 836,239
[22] PCT Filed: Nov. 2, 1995
[86] PCT No.: PCT/EP95/04287
  § 371 Date: Apr. 28, 1997
  § 102(e) Date: Apr. 28, 1997
[87] PCT Pub. No.: WO96/14729
  PCT Pub. Date: May 17, 1996

[30] Foreign Application Priority Data

Nov. 5, 1994 [DE] Germany .................. 44 39 607.4

[51] Int. Cl.⁶ .................. H05K 7/18; H02B 1/38
[52] U.S. Cl. .................. 312/265 B; 312/265.4; 312/265.5; 312/265.6; 49/401
[58] Field of Search .................. 312/265.2, 265.3, 312/265.1, 265.6, 265.5, 265.4; 49/401, 395

[56] References Cited

U.S. PATENT DOCUMENTS

| | | | |
|---|---|---|---|
| 4,229,921 | 10/1980 | Schell .................. | 312/265.6 X |
| 4,671,015 | 6/1987 | Curry et al. .................. | 49/395 X |
| 4,966,424 | 10/1990 | Schneider .................. | 312/265.6 |
| 5,165,770 | 11/1992 | Hahn .................. | 312/265.6 X |
| 5,222,871 | 6/1993 | Meyer et al. .................. | 312/265.2 X |
| 5,228,762 | 7/1993 | Mascrier .................. | 312/265.1 X |
| 5,275,296 | 1/1994 | Zachrai . | |
| 5,407,263 | 4/1995 | Jones et al. .................. | 312/265.1 |
| 5,498,073 | 3/1996 | Charbonneau et al. .................. | 312/265.4 X |

FOREIGN PATENT DOCUMENTS

| | | | |
|---|---|---|---|
| 0389910 | 3/1990 | European Pat. Off. . | |
| 2697300 | 4/1994 | France . | |
| 2437645 | 2/1976 | Germany .................. | 312/265.4 |
| 8107658 | 7/1981 | Germany . | |
| 4036664 | 5/1992 | Germany . | |
| 4132803 | 4/1993 | Germany . | |
| 581810 | 9/1958 | Italy .................. | 312/265.1 |
| 1336991 | 11/1973 | United Kingdom .................. | 312/265.1 |

*Primary Examiner*—Peter M. Cuomo
*Assistant Examiner*—David E. Allred
*Attorney, Agent, or Firm*—Speckman Pauley Petersen & Fejer

[57] ABSTRACT

A switchgear cabinet with a frame made up of frame members and corner joints. The open sides of the frame are or may be closed by side walls, a rear wall, a bottom plate, a cover plate and at least one door. A special design of the frame members in the area of their outer edges and of the corner joints makes it simple to attach a door.

13 Claims, 2 Drawing Sheets

SWITCHGEAR CABINET WITH FRAME

BACKGROUND OF THE INVENTION

1. Field of the Invention

This invention relates to a switchgear cabinet with a rack constructed of frame legs and corner connectors, with open sides that can be closed or are closed by lateral walls, and having a rear wall, a sheet metal bottom piece, a sheet metal cover piece and at least one door.

2. Description of Prior Art

In conventional switchgear cabinets, two profiled sides of the frame legs placed vertically with respect to each other normally form exteriors of the rack and one of the exterior edges of the rack. For hinging such door it is necessary to attach hinge elements on the vertical frame legs. In addition, on the lock side of the door it is necessary to attach locking elements for the locking device attached to the door. In this case the attachment side of the door to the rack is often fixed and cannot be changed in a simple manner at the place where the switchgear cabinet is used. Normally, an open side of the rack is closed by the door.

SUMMARY OF THE INVENTION

In connection with a switchgear cabinet of the type mentioned above, it is one object of this invention to hinge a door on a rack without special hinge and closing elements, wherein the attachment side and the closing side can be easily interchanged and wherein the door intended for one side of the rack can also be arbitrarily attached to the opposite side of the rack.

This object is attained in accordance with one preferred embodiment of this invention wherein at least the vertical frame legs are beveled in an area of outer edges and thus constitute a receiver for beveled edges of the lateral walls and the door. The corner connectors cover the receivers of the frame legs and have on a side facing the receivers plug receivers or hinge bolts. On a hinge side the door has hinge bolts or plug receivers, which can be inserted or are inserted into the plug receivers of the corner connectors, or into which the hinge bolts of the door are inserted or can be inserted. On a lock side the door has locking bolts, which can be inserted into and removed from plug receivers of the corner connectors by a closure device.

With this embodiment of the frame legs and corner connectors, the corner connectors also assume functions required for hinging and locking the door. What is needed is to provide plug receivers or hinge bolts on the corner connectors. The frame legs do not need to have hinge or locking elements. The receivers formed on the frame legs in an area of the outer edges provide sufficient space for receiving the beveled edge sections of the lateral walls and the door.

In accordance with one embodiment of this invention, the frame legs have two profiled sides placed vertically with respect to each other, which form exteriors of the rack. The profiled sides are connected with each other in an area of the outer edge by a profiled connecting section, which is placed at an angle of 135° with respect to these profiled sides. With this embodiment the frame leg can be used as the hinge or lock side of the door for both adjoining sides of the rack.

The receiver in the area of the outer edge of the frame legs can be enlarged if the profiled sides make a transition into the connecting section with profiled transition sections which are placed vertically with respect to each other.

If the corner connectors have two surfaces located vertically with respect to each other, which constitute portions of the outer edges of the rack, and the surfaces terminate flush with the exteriors of the adjoining lateral walls and the closed door, there is a flush termination in a corner area of the switchgear cabinet.

In accordance with one embodiment, screws connect the lateral walls, the rear wall, the sheet metal bottom piece and the sheet metal cover piece to the corner connectors. Fastening on the frame legs is also possible without the wall elements having fastening bores for fastening screws.

Attachment of the door on the rack is made easier by the hinge bolts or locking bolts being adjustably guided and/or maintained in bearing sleeves attached to the door.

The hinging of a door can also be performed in a simple manner with the hinge bolts, guided through bearing sleeves of the door, inserted into plug receivers of the corner connectors and held therein with a snug fit and/or a press fit.

BRIEF DESCRIPTION OF THE DRAWINGS

This invention will be explained in detail by an exemplary embodiment shown in the drawings wherein.

DESCRIPTION OF PREFERRED EMBODIMENTS

Figure 1:
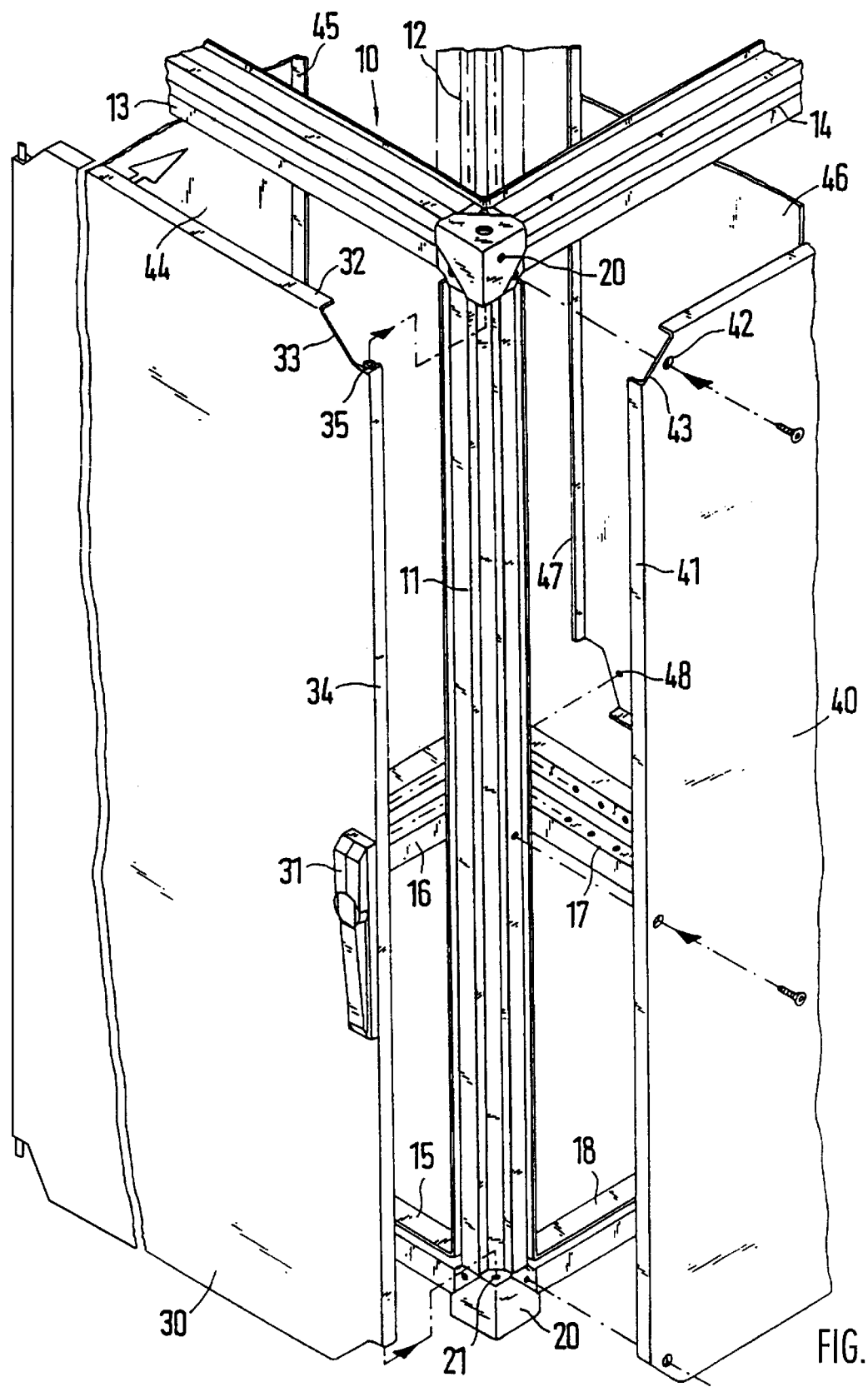
FIG. 1 is an exploded perspective partial view of a rack with a front right frame leg, to which a lateral wall and a door is attached.
Figure 2:
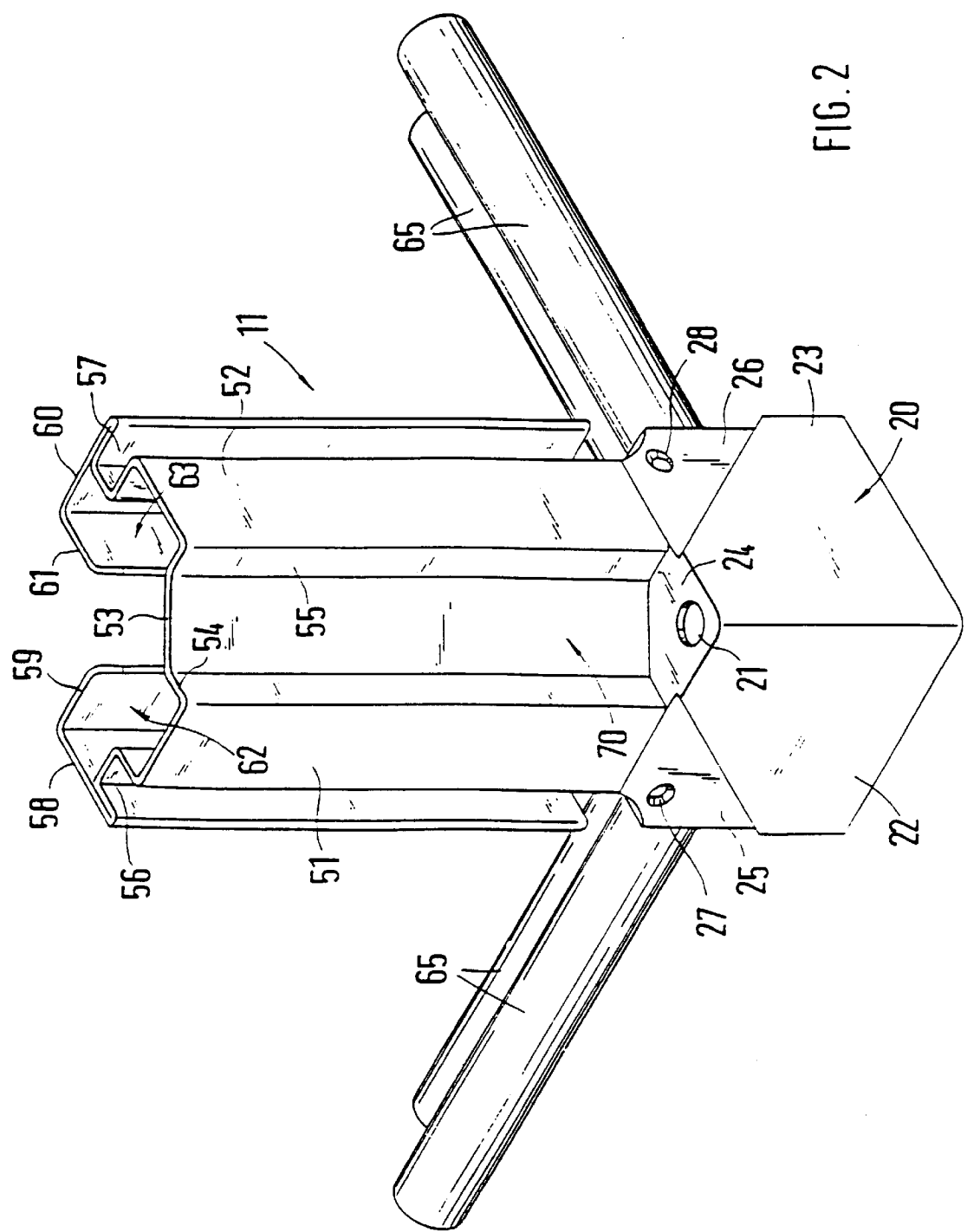
FIG. 2 is a perspective partial view in an area of a lower corner connector at a front right frame leg.

Only the vertical frame legs 11 and 12 at the front right corner and the rear left corner of a rack 10 are shown in FIG. 1. The horizontal frame legs 13 and 14 are connected by means of a corner connector 20 at the upper end of the vertical frame leg 11. The horizontal frame legs 15, 16, 17 and 18 are shown in the lower area, of which the frame legs 15 and 18 are connected by a corner connector 20 with the lower end of the vertical frame leg 11. The lateral walls 40 and 44 are screwed to the corner connectors 20, wherein in these areas the corners are beveled and without edges, as can be seen from the corner 43 of the lateral wall 40. The edge areas 41 and 45 of the lateral walls 40 and 44 project into receivers 70 of the frame legs. As shown in FIG. 2, the frame legs are beveled in the area of their outer edge and form a receiver 70 together with the connecting section 53 and the transition sections 54 and 55. The corner connector 20 covers the receiver 70 with a shoulder 24. The shoulder 24 of the corner connector 20 has a plug receiver 21. The surfaces 22 and 23 of the corner connector 20, which are positioned vertically with respect to each other, are flush with the exteriors of the switchgear cabinet, such as the exteriors of lateral walls 40 and 44, the rear wall 46 and the door 30 attached to the corner connector 20. The contact surfaces 25 and 26 for these elements are set back by the amount of their thickness with respect to the surfaces 22 and 23 of the corner connector 20 in order to achieve a flush fit. The contact surfaces 25 and 26 have threaded receivers 27 and 28 for screwing.

The plug projections 65 of the corner connectors 20 are inserted into receivers 62 and 63 of the frame legs and fixed therein. The receivers 62 and 63 are delimited by multiple bent sections 56, 58, 59 or 57, 60, 61. The thrice bent sections 56 and 57 form receiving grooves, open toward the outside, for sealing elements. The receiving grooves 56 and 57 are located in the area of profile sides 51 and 52, which are placed vertically with respect to each other, and against which rest the lateral walls 40 and 44, the rear wall 46, the door 30 and the sheet metal bottom and cover pieces, not represented in the drawings.

Hinge bolts, which can be adjusted and fixed in place, for example, in bearing sleeves of the door 30, are used for fastening the door 30. For fastening the door 30, the two hinge bolts on the hinge side are inserted into the plug receivers 21 of the two associated corner connectors 20 and fixed in place in the inserted position.

In this case fixation in place can be in the bearing sleeve of the door 30 or in the plug receiver 21 of the corner connectors 20.

The lateral walls 40 and 44, the rear wall 46 and the door 30 can have beveled edge sections 41, 45, 47 or 32 and 33, that are accommodated in the receivers 70 of the frame legs 11 to 18.

On the locking side the door 30 has a locking device 31 which can be embodied as a push rod lock, for example. The push rods are used as lock bolts 35 and are adjustably inserted and held in bearing sleeves of the door 30. In the locked state of the locking device 31, the push rod ends are introduced as lock bolts 35 into the plug receivers 21 of the adjoining corner connectors 20. When opening the locking device 31, the push rod ends are removed from the plug receivers 21 of the corner connectors 20, and the door 30, hinged on the hinge side, can be opened.

The lateral walls, the rear wall, the sheet metal bottom piece and the sheet metal cover piece can be attached by fastening means not visible from the outside.

We claim:

1. In a switchgear cabinet having a rack frame with a plurality of horizontal and vertical frame legs assembled together by a plurality of corner connectors forming a frame with a plurality of open sides selectively closed by lateral walls, a rear wall, and at least one door, the improvement comprising:

vertical frame legs (11) of the frame legs having a plurality of outer edges beveled forming a plurality of recessed receivers (70) in said frame selectively receiving a plurality of beveled edges (34, 41, 45) of the lateral walls (40, 44) and the door (30), the corner connectors (20) connected to ends of the horizontal and vertical frame legs, said corner connectors having a shoulder (24) forming end walls of the receivers (70), said end walls having on sides facing into the receivers (70) a plurality of plug receivers (21) forming vertically aligned pairs at opposite ends of the vertical frame legs, a lock side of the door (30) having a plurality of locking bolts (35), which are selectively inserted into the plug receivers (21) of the corner connectors (20) by a closure device (31), said plug receivers alternatively receiving hinge bolts of an opposite hinge side of the door whereby the direction of swing for the door may be selected.

2. In the switchgear cabinet in accordance with claim 1, wherein the frame legs (11) have two profiled sides (51, 52) placed perpendicular with respect to each other which form exteriors of the rack frame (10), and the profiled sides (51, 52) connected with each other near the outer edges by the recessed receiver (70) comprising a profiled connecting section (53) which is placed at an angle of 135° with respect to the profiled sides (51, 52).

3. In the switchgear cabinet in accordance with claim 2, wherein the recessed receiver (70) comprises a connecting section (53) and a plurality of profiled transition sections (54, 55) which are placed perpendicular with respect to corresponding ones of the profiled sides (51, 52).

4. In the switchgear cabinet in accordance with claim 3, wherein the corner connectors (20) have two surfaces (22, 23) positioned perpendicular with respect to each other forming the outer edges of the rack frame (10), and the surfaces (22, 23) terminate flush with exterior surfaces of the lateral walls (40, 44) and the closed door (30).

5. In the switchgear cabinet in accordance with claim 4, wherein the lateral walls (40, 44) and the rear wall (46) are screwed together with the corner connectors (20), wherein the corner connectors (20) have a plurality of contact surfaces (25, 26) set back by a thickness of the lateral walls (40, 44).

6. In the switchgear cabinet in accordance with claim 5, wherein the hinge bolts are attached with respect to the door (30).

7. In the switchgear cabinet in accordance with claim 6, wherein the hinge bolts are inserted into the plug receivers (21) of the corner connectors (20) and secured with a press fit.

8. In the switchgear cabinet in accordance with claim 7, wherein the lateral walls (40, 44) and the rear wall (46) are fastened on the frame legs.

9. In a switchgear cabinet having a rack frame with a plurality of frame legs connected together by a plurality of corner connectors, said rack frame forming a plurality of open sides which can be closed by lateral walls, a rear wall, and at least one door, the improvement comprising:

at least two vertical frame legs (11) of the frame legs having a plurality of outer edges beveled forming a plurality of recessed receivers (70) receiving a plurality of beveled edges (34, 41, 45) of the lateral walls (40, 44) and the door (30), the corner connectors (20) connected to and covering ends of the receivers (70) of the vertical frame legs (11) and having on a side facing into the receivers (70) a plurality of plug receivers (21), a lock side of the door (30) having a plurality of locking bolts (35), which are selectively inserted into the plug receivers (21) of the corner connectors (20) by a closure device (31), said plug receivers alternatively receiving hinge bolts of an opposite hinge side of the door whereby the direction of swing for the door may be selected, the corner connectors (20) having two surfaces (22, 23) positioned perpendicular with respect to each other forming the outer edges of the rack (10), and the surfaces (22, 23) terminating flush with exterior surfaces of the lateral walls (40, 44) and the closed door (30).

10. In the switchgear cabinet in accordance with claim 1, wherein the lateral walls (40, 44) and the rear wall (46) are screwed together with the corner connectors (20), wherein the corner connectors (20) have a plurality of contact surfaces (25, 26) set back by a thickness of the lateral walls (40, 44).

11. In the switchgear cabinet in accordance with claim 1, wherein the hinge bolts are attached to the door (30).

12. In a switchgear cabinet having a rack frame with a plurality of frame legs connected together by a plurality of corner connectors, said rack frame forming a plurality of open sides which can be closed by lateral walls, a rear wall, and at least one door, the improvement comprising:

at least two vertical frame legs (11) of the frame legs having a plurality of outer edges beveled forming a plurality of recessed receivers (70) receiving a plurality of beveled edges (34, 41, 45) of the lateral walls (40, 44) and the door (30), the corner connectors (20) connected to and covering ends of the receivers (70) of the vertical frame legs (11) and having on a side facing into the receivers (70) a plurality of plug receivers (21), a lock side of the door (30) having a plurality of locking bolts (35), which are selectively inserted into the plug receivers (21) of the corner connectors (20) by a closure device (31), said plug receivers alternatively receiving hinge bolts of an opposite hinge side of the door whereby the direction of swing for the door may be selected, the hinge bolts attached with respect to the door (30) being inserted into the plug receivers (21) of the corner connectors (20) and secured with a press fit.

13. In a switchgear cabinet having a rack frame with a plurality of frame legs connected together by a plurality of corner connectors, said rack frame forming a plurality of open sides which can be closed by lateral walls, a rear wall, and at least one door, the improvement comprising:

at least two vertical frame legs (11) of the frame legs having a plurality of outer edges beveled forming a plurality of recessed receivers (70) receiving a plurality of beveled edges (34, 41, 45) of the lateral walls (40, 44) and the door (30), the corner connectors (20) connected to and covering ends of the receivers (70) of the vertical frame legs (11) and having on a side facing into the receivers (70) a plurality of plug receivers (21), a lock side of the door (30) having a plurality of locking bolts (35), which are selectively inserted into the plug receivers (21) of the corner connectors (20) by a closure device (31), said plug receivers alternatively receiving hinge bolts of an opposite hinge side of the door whereby the direction of swing for the door may be selected, the lateral walls (40, 44) and the rear wall (46) being fastened on the frame legs.

\* \* \* \* \*